US012628692B2

(12) United States Patent
Ho et al.

(10) Patent No.: US 12,628,692 B2
(45) Date of Patent: May 12, 2026

(54) SEMICONDUCTOR PACKAGE, SEMICONDUCTOR BONDING STRUCTURE, AND METHOD OF FABRICATING THE SAME

(71) Applicant: UNITED MICROELECTRONICS CORP., Hsin-Chu City (TW)

(72) Inventors: Kai-Kuang Ho, Hsinchu City (TW); Yu-Jie Lin, Taichung City (TW); Yi-Feng Hsu, Hsinchu City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 626 days.

(21) Appl. No.: 17/989,635

(22) Filed: Nov. 17, 2022

(65) Prior Publication Data

US 2024/0120316 A1     Apr. 11, 2024

(30) Foreign Application Priority Data

Oct. 11, 2022    (TW) .................................. 111138340

(51) Int. Cl.
| | |
|---|---|
| *H01L 25/065* | (2023.01) |
| *H10W 74/10* | (2026.01) |
| *H10W 90/00* | (2026.01) |
| *H10W 70/65* | (2026.01) |
| *H10W 72/29* | (2026.01) |

(52) U.S. Cl.
CPC .......... *H10W 90/00* (2026.01); *H10W 74/111* (2026.01); *H10W 70/65* (2026.01); *H10W 72/29* (2026.01); *H10W 90/724* (2026.01); *H10W 90/792* (2026.01)

(58) Field of Classification Search
None
See application file for complete search history.

(56) References Cited

U.S. PATENT DOCUMENTS

| | | | |
|---|---|---|---|
| 9,082,766 B2 * | 7/2015 | Goudarzi | ................ H01L 24/81 |
| 9,293,401 B2 * | 3/2016 | Yoon | ..................... H01L 21/311 |
| 9,754,852 B2 | 9/2017 | Huemoeller et al. | |
| 10,170,409 B2 | 1/2019 | Ganesan et al. | |
| 11,476,201 B2 * | 10/2022 | Chen | ................... H01L 21/4853 |
| 2014/0252609 A1 * | 9/2014 | Lee | ........................ H01L 25/105 |
| | | | 438/126 |
| 2014/0264810 A1 * | 9/2014 | Hsu | ........................ H01L 21/561 |
| | | | 438/109 |
| 2025/0112193 A1 * | 4/2025 | Song | ................... H01L 21/6835 |

* cited by examiner

*Primary Examiner* — Long Pham
(74) *Attorney, Agent, or Firm* — Winston Hsu

(57) ABSTRACT

The present disclosure relates to a semiconductor package, a semiconductor bonding structure and a method of fabricating the same. The semiconductor package includes a first chip, a second chip and a conductive structure, wherein the conductive structure is disposed at a side of the second chip and over a second upper surface of the first interconnection structure to electrically connect to the first interconnection structure. The semiconductor bonding structure includes a first substrate, a plurality of first interconnection structures, a plurality of chips and a plurality of conductive structures, wherein the conductive structures are respectively disposed at a side of each of the chips and over a second upper surface of each first interconnection structure, to electrically connect to each first interconnection.

4 Claims, 12 Drawing Sheets

SEMICONDUCTOR PACKAGE, SEMICONDUCTOR BONDING STRUCTURE, AND METHOD OF FABRICATING THE SAME

BACKGROUND OF THE INVENTION

1. Field of the Invention

The present disclosure relates to a semiconductor technology, and more particularly, to a semiconductor package, a semiconductor bonding structure and a method of fabricating the same.

2. Description of the Prior Art

In advanced semiconductor industry, integration density of various electronic components has been continuously improved by reducing minimum feature size, which allows more electronic components to be integrated into given areas. These smaller electronic components also require smaller packages that utilize less area than the conventional packages.

Three dimensional integrated circuits (3DICs) refer to a three-dimensional stack of chips formed by using wafer-level bonding and through-silicon-via (TSV) technologies. In comparison with conventional two-dimensional chips, the 3DICs may have the advantages of using the space more effectively, shorter signal transmission distances between chips, and lower interconnecting resistances. The 3DICs have gradually become the mainstream technology of power converters, low noise amplifiers, radio frequency (RF) or millimeter wave (MMW) components. Furthermore, the 3DICs may also be achieved by placing chips over chips of a wafer-level, or forming a bonding interface between the chips by a hybrid bonding process. The hybrid bonding (also known as "metal/dielectric hybrid bonding") may be a direct bonding technology without using intermediate layers like solder bond or adhesives, which obtains metal-to-metal bonding and dielectric-to-dielectric bonding simultaneously, so as to overcome the fabrication limits of the micro bump technology.

However, the current 3DICs still have problems need to be further improved to meet the semiconductor industrial requirements.

SUMMARY OF THE INVENTION

In light of the above, the present disclosure is directed to provide a semiconductor package, a semiconductor bonding structure, and a method of fabricating the same, in which the semiconductor package is fabricated by copper-to-copper direct bonding in a chip-to-wafer bonding manner, and the chip and a conductive structure are respectively bonded to two different upper surfaces of an interconnection structure of the wafer. Accordingly, the copper-to-copper direct bonding is not only capable to replace the conventional through-silicon-via (TSV) structure, simplifying the fabricating complexity and cost of the TSV, but also improves the structural defects possibly derived from the TSV structure. Therefore, the present disclosure is allowable to form the semiconductor package with more reliable structure under a simplified fabricating process, with the conductive structure being disposed at a location higher than the chip, so as to facilitate the arrangements of input/output terminals in the subsequent fabricating processes.

According to an embodiment of the present disclosure, a semiconductor package is provided and includes a first chip, a second chip, and a conductive structure. The first chip includes a first substrate and a first interconnection structure disposed on the first substrate, wherein an upper surface of the first interconnection structure includes a first upper surface and a second upper surface. The second chip is stacked on the first chip, and the second chip includes a second substrate and a second interconnection structure disposed on the second substrate, wherein the second interconnection structure directly and electrically connects to the first upper surface of the first interconnection structure. The conductive structure is disposed at one side of the second chip, on the second upper surface of the first interconnection structure, and the conductive structure electrically connected to the first interconnection structure.

According to an embodiment of the present disclosure, a semiconductor bonding structure is provided and includes a primary substrate, a plurality of first interconnection structures, a plurality of chips, and a plurality of conductive structures. The plurality of first interconnection structures is disposed on the primary substrate, wherein an upper surface of each of the first interconnection structures includes a first upper surface and a second upper surface. The plurality of chips is disposed on the first interconnection structures and electrically connected to the first interconnection structures respectively, and each of the chips includes a substrate and a second interconnection structure disposed on the substrate, wherein the second interconnection structure directly and electrically connects to the first upper surface of each of the first interconnection structures. The plurality of conductive structures is disposed at one side of each of the chips, on the second upper surface of each of the first interconnection structures, and the conductive structures electrically connects to the first interconnection structures respectively.

According to an embodiment of the present disclosure, a method of forming a semiconductor bonding structure is provided and includes the following steps. Firstly, a first semiconductor structure is formed, wherein the first semiconductor structure includes a first substrate and a first interconnection structure disposed on the first substrate, and an upper surface of the first interconnection structure comprises a first upper surface and a second upper surface. Next, a second semiconductor structure is formed, wherein the second semiconductor structure includes at least one chip, and the second semiconductor structure is bonded to the first upper surface of the first interconnection structure of the first semiconductor structure. Then, at least one conductive structure is formed at one side of the second semiconductor structure, on the second upper surface of the first interconnection structure to electrically connect to the first interconnection structures.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 6 illustrate schematic diagrams of a fabricating method of a semiconductor bonding structure and a semiconductor package according to a first embodiment of the present disclosure, in which:

FIG. 1 is a schematic cross-sectional view of a semiconductor bonding structure after forming an interconnection structure;

FIG. 2 is a schematic cross-sectional view of a semiconductor bonding structure after forming and bonding to a chip;

FIG. 3 is a schematic cross-sectional view of a semiconductor bonding structure after forming a covering layer;

FIG. 4 is a schematic cross-sectional view of a semiconductor bonding structure after forming a molding layer and openings;

FIG. 5 is a schematic cross-sectional view of a semiconductor bonding structure after forming a conductive structure; and FIG. 6 is a schematic cross-sectional view of a semiconductor bonding structure after forming the semiconductor package.

FIG. 7 to FIG. 8 illustrate schematic diagrams of a fabricating method of a semiconductor bonding structure and a semiconductor package according to a second embodiment of the present disclosure, in which:

FIG. 7 is a schematic cross-sectional view of a semiconductor bonding structure after forming a conductive structure; and FIG. 8 is a schematic cross-sectional view of a semiconductor bonding structure after forming the semiconductor package.

FIG. 9 to FIG. 11 illustrate schematic diagrams of a fabricating method of a semiconductor bonding structure and a semiconductor package according to a third embodiment of the present disclosure, in which:

FIG. 9 is a schematic cross-sectional view of a semiconductor bonding structure after forming a protection layer;

FIG. 10 is a schematic cross-sectional view of a semiconductor bonding structure after forming a conductive structure; and FIG. 11 is a schematic cross-sectional view of a semiconductor bonding structure after forming the semiconductor package.

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
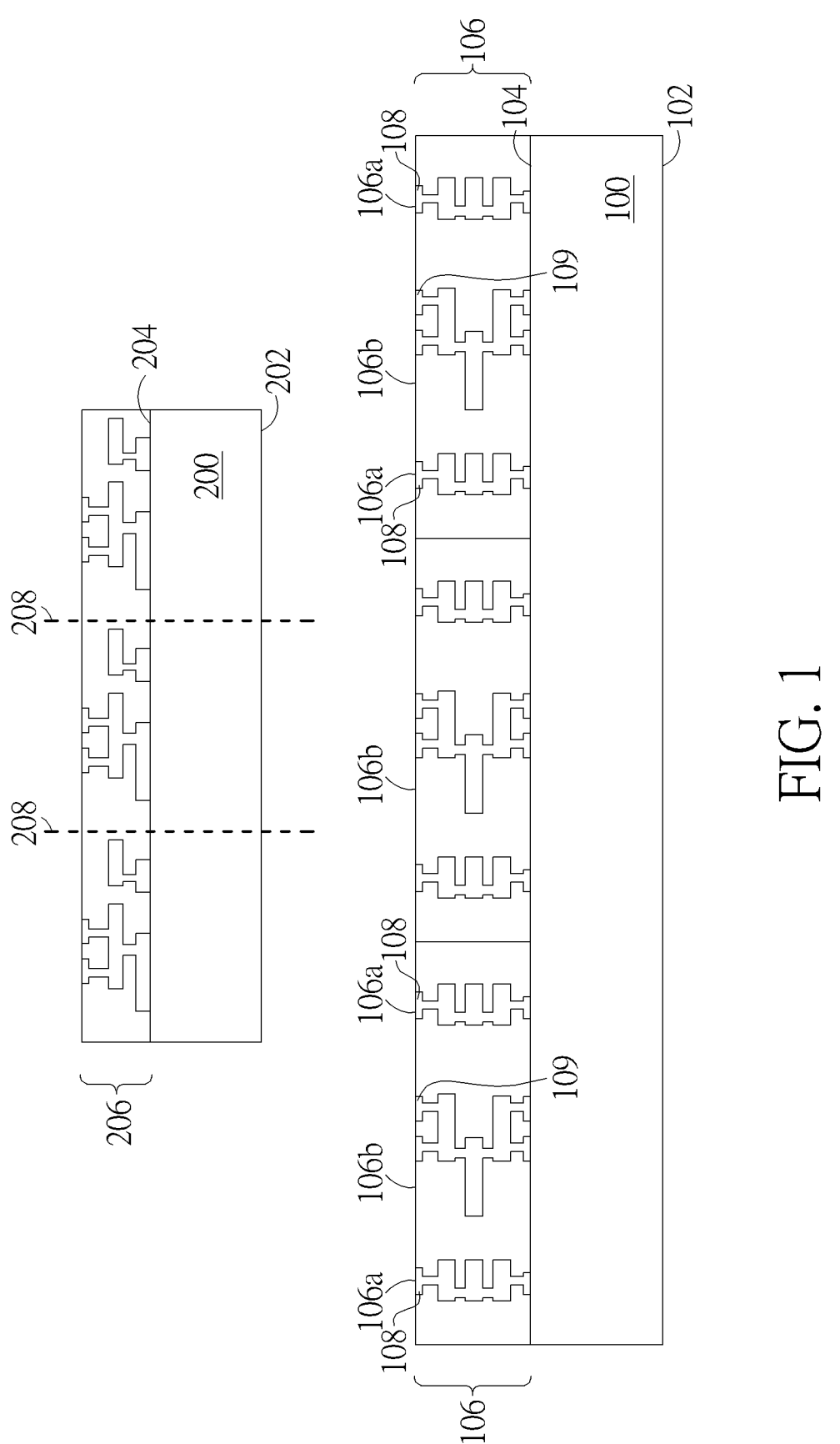

Please refer to FIG. 1 to FIG. 6, which illustrate schematic diagrams of a fabricating method of a semiconductor bonding structure and a semiconductor package according to the first embodiment of the present disclosure. Firstly, as shown in FIG. 1, a semiconductor structure such as a wafer-level semiconductor structure is provided, and which includes a primary substrate 100 and at least one interconnection structure 106. The primary substrate 100 for example includes a silicon substrate, an epitaxial silicon substrate, a silicon-containing substrate such as a SiC substrate or a SiGe substrate, a group III-V semiconductor substrate or a substrate including any suitable material, and the primary substrate 100 has two surfaces 102, 104 opposite disposed to each other.

In the present embodiment, a plurality of interconnection structures 106 are formed on the surface 104 of the primary substrate 100, with the interconnection structures 106 being directly adjacent to each other and respectively disposed within a plurality of die regions (not shown in the drawings) on the primary substrate 100, wherein each of the die regions may include various types of wafers or are expected to provide various functions, for example being used as a display driver integrated circuit (DDIC), a radio frequency (Rf), a dynamic random access memory (DRAM), a static random access memory (SRAM), or a driver circuit, but is not limited thereto. Each of the interconnection structures 106 includes a plurality of sequentially stacked dielectric layers (not shown in the drawings) and a plurality of conductive layers (not shown in the drawings) disposed in each of the dielectric layers, wherein the dielectric layers for example include a dielectric material such as silicon oxide, silicon nitride, silicon oxynitride or silicon carbonitride, and the conductive layers for example includes a low resistant metal material like copper (Cu), aluminum (Al), tungsten (W) or titanium (Ti), and preferably includes copper, but is not limited thereto.

It is noted that, each of the interconnection structures 106 further includes at least one bonding pad 108, 109 embedded in the interconnection structure 106, so that, the surfaces of the bonding pads 108, 109 are respectively exposed from an upper surface 106a and an upper surface 106b of each interconnection structure 106. The upper surface 106a and the upper surface 106b may be optionally coplanar with each other, and both disposed on a top surface of the interconnection structure 106, but not limited thereto. In another embodiment, the surfaces of the bonding pads 108, 109 may also be respectively exposed from two upper surfaces which are not coplanar with each other, due to practical product requirements. Also, although the present embodiment is exemplified by disposing one bonding pads 108 at two opposite sides of the bonding pads 109 respectively, people well-skilled in the art should fully realized that the practical disposing number and the disposing locations of the bonding pads 108 and/or the bonding pads 109 are not limited to what is shown in FIG. 1, and which may be further adjusted based on practical requirements.

Next, another semiconductor structure such as a semiconductor structure which is also a wafer-level semiconductor structure is provided, and which includes a primary substrate 200 (for example including a silicon substrate, an epitaxial silicon substrate, a silicon-containing substrate, or a group III-V semiconductor substrate) having two opposite surfaces 202, 204, and at least one interconnection structure 206. In the present embodiment, a plurality of interconnection structures 206 are also formed on the surface 204 of the primary substrate 200, with the interconnection structures 206 being directly adjacent to each other and respectively disposed within a plurality of die regions (not shown in the drawings) on the primary substrate 200, wherein each of the interconnection structures 206 also includes a plurality of sequentially stacked dielectric layers (not shown in the drawings) and a plurality of conductive layers (not shown in the drawings) disposed in each of the dielectric layers. The material selections of the dielectric layers and the conductive layers of the interconnection structures 206 are substantially the same as that of the interconnection structures 106, and which will not be redundant described hereinafter. Also, people well-skilled in the art should fully realized that the practical disposing number of the interconnection structures 106 and/or the interconnection structures 206 are not limited to what is shown in FIG. 1, and which may be further adjusted according to the practical require number of the die regions in a device.

Figure 2:
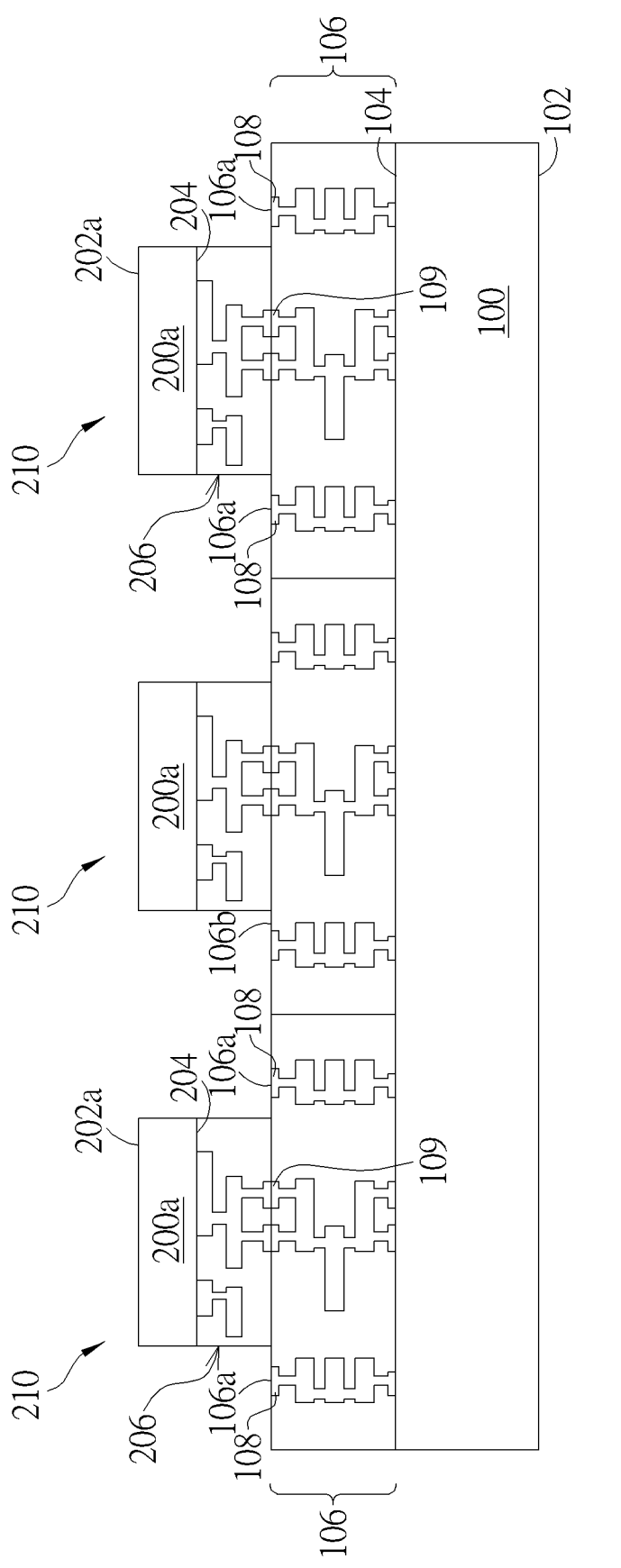

In the present embodiment, the another semiconductor structure further includes a plurality of scribe lines 208 at the junctions of the die regions of the primary substrate 200 respectively, so that, the primary substrate 200 and the plurality of the interconnection structures 206 of the another semiconductor structure may be cut into a plurality of chips 210 as shown in FIG. 2 through the scribe lines 208, in the subsequent die saw process. It is noted that, each of the chips 210 includes a substrate 200a and the interconnection structure 206 disposed on the surface 204 of the substrate 200a.

As shown in FIG. 2, the semiconductor structure and the chips 210 are placed on a machine (not shown in the drawings) capable of performing a die bonding process, for bonding the chips 210 to the semiconductor structure. In the present embodiment, the die bonding process is carried by attaching and bonding the interconnection structure 206 of each of the chips 210 to the upper surfaces 106b of each of the interconnection structures 106 on the semiconductor structure, and exposing the two upper surfaces 106a (namely, the surfaces of the bonding pads 108) at both two sides of the upper surface 106b. With these arrangements, at least one conductive layer of each of the interconnection structures 206 may directly contact the bonding pads 109 of each of the interconnection structures 106, and the chips 210 are electrically connected with the semiconductor structure. Furthermore, in the present embodiment, a wafer thinning process such as a chemical mechanical polishing (CMP) process or an etching process may be optionally performed on the surface 202 of the primary substrate 200, before performing the die saw process, to reduce the overall thickness of the primary substrate 200 and to form a surface 202a. People well-skilled in the art should fully realized that the reduced thickness of the substrate by the wafer thinning process may be adjusted according to the practical process requirements, so as to avoid the possible structural defects caused by excessive increasing of the overall thickness after forming a molding layer in the subsequent process. Also, the heat dissipation efficiency of the substrate 200a may be enhanced thereby through reducing the overall thickness of the substrate.

Figure 3:
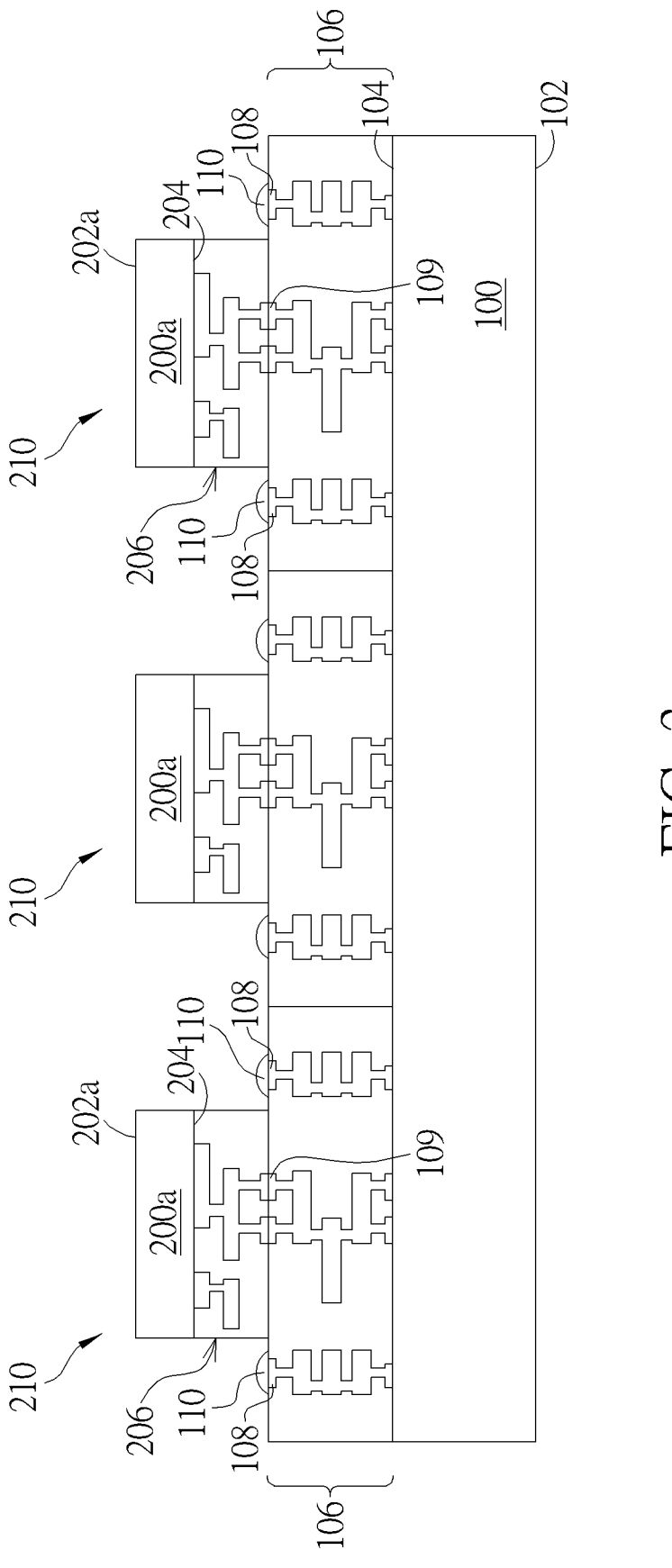

As shown in FIG. 3, a covering layer 110 is formed on the upper surfaces 106a of each of the interconnection structure 106, to cover the surfaces of the bonding pads 108. Precisely speaking, a deposition process such as a redox deposition process, or an electroplating process such as electroless plating or chemical plating is performed to form the covering layer 110 on the bonding pads 108, at both two sides of each of the chips 210, thereby preventing from the metal oxidation of the bonding pads 108. In the present embodiment, the covering layer 110 for example includes a conductive material with protective capability, such as a metal material that is not easily oxidized, such as tin (Sn), gold (Au), palladium (Pd), nickel (Ni) and silver (Ag), and preferably to solder bond, but not limited thereto. In another embodiment, the covering layer may also include a non-conductive material with protective capability.

Figure 4:
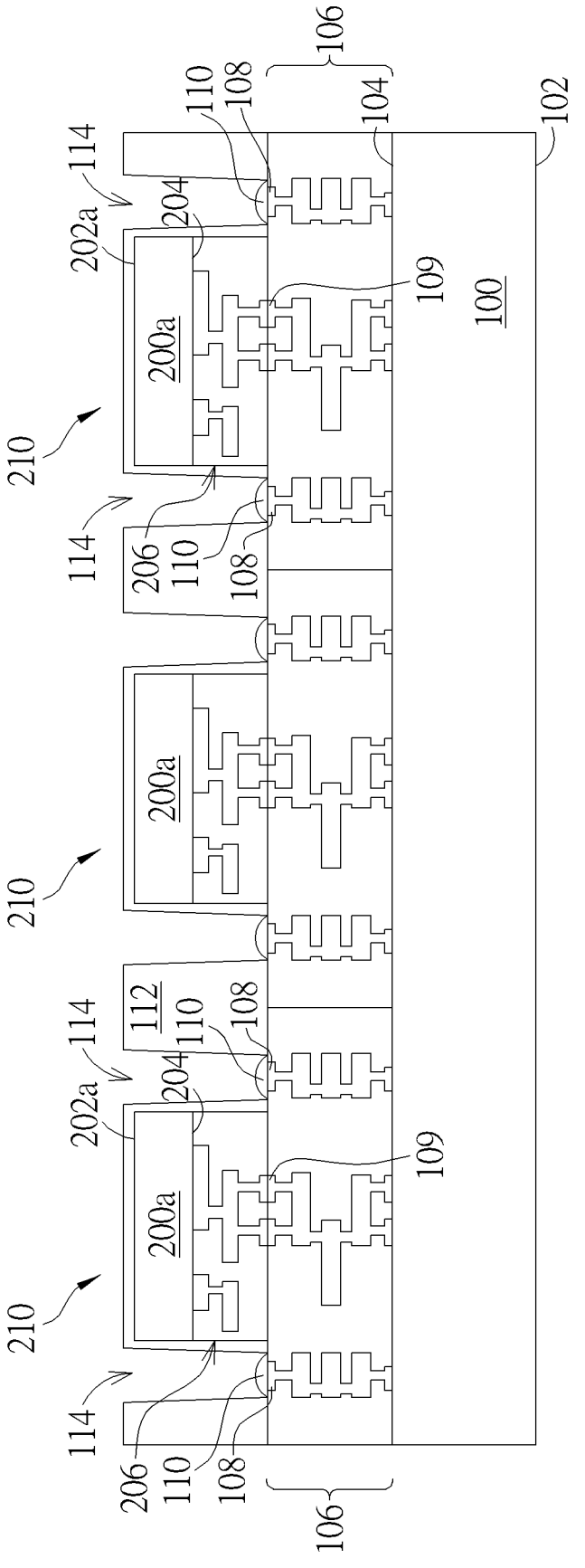

As shown in FIG. 4, a molding layer 112 is formed on the semiconductor structure and the chips 210, to cover the chips 210 and the first interconnection structures 106 of the semiconductor structure, so as to overall perform like a wafer-level semiconductor structure. Precisely speaking, the molding layer 112 includes a plurality of openings 114, and each of the openings 114 is in alignment with each of the bonding pads 108 underneath, thereby exposing the covering layer 110 covered on each of the bonding pads 108 through each opening 114. In one embodiment, the formation of the openings 114 is accomplished for example through a photolithography and etching process, a dry etching process or a laser burning process. Preferably, the laser burning process is performed by using the covering layer 110 as a stop layer, so as to save the fabricating cost, but not limited thereto.

Figure 5:
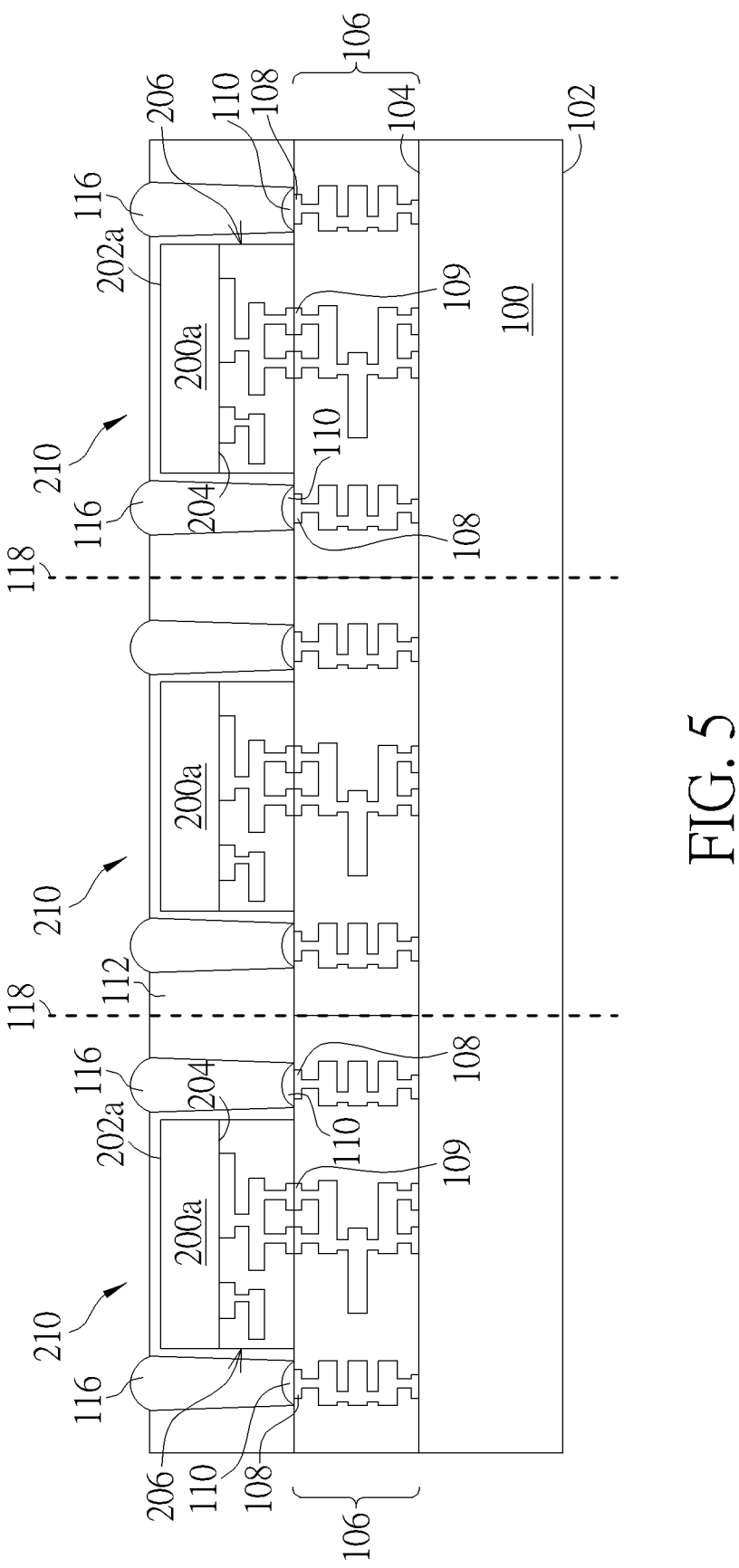

As shown in FIG. 5, at least one conductive structure is formed on the semiconductor structure. In the present embodiment, the conductive structure for example includes at least one solder pillar 116 at least filled up the openings 114 as shown in FIG. 4, wherein the solder pillars 116 for example include a material like tin, gold, or palladium, but is not limited thereto. In a preferably embodiment, the solder pillars 116 may include the same material as the covering layer 110, such as solder bond, so that, the solder pillars 116 may therefore be formed by a reflow soldering process. Accordingly, the solder pillars 116 and the covering layer 110 underneath may be monolithic, but is not limited thereto. It is noted that, the solder pillars 116 is partially disposed within the molding layer 112, and is partially protruded from the top surface of the molding layer 112, so that, the bottom of the solder pillars 116 may contact the bonding pads 108 directly or through the covering layer 110, to electrically connect with the interconnection structures 106, and the top of the solder pillars 116 is protruded from the molding layer 112, for conveniently arranging the input/output terminals (I/O) in the subsequent processes.

Figure 6:
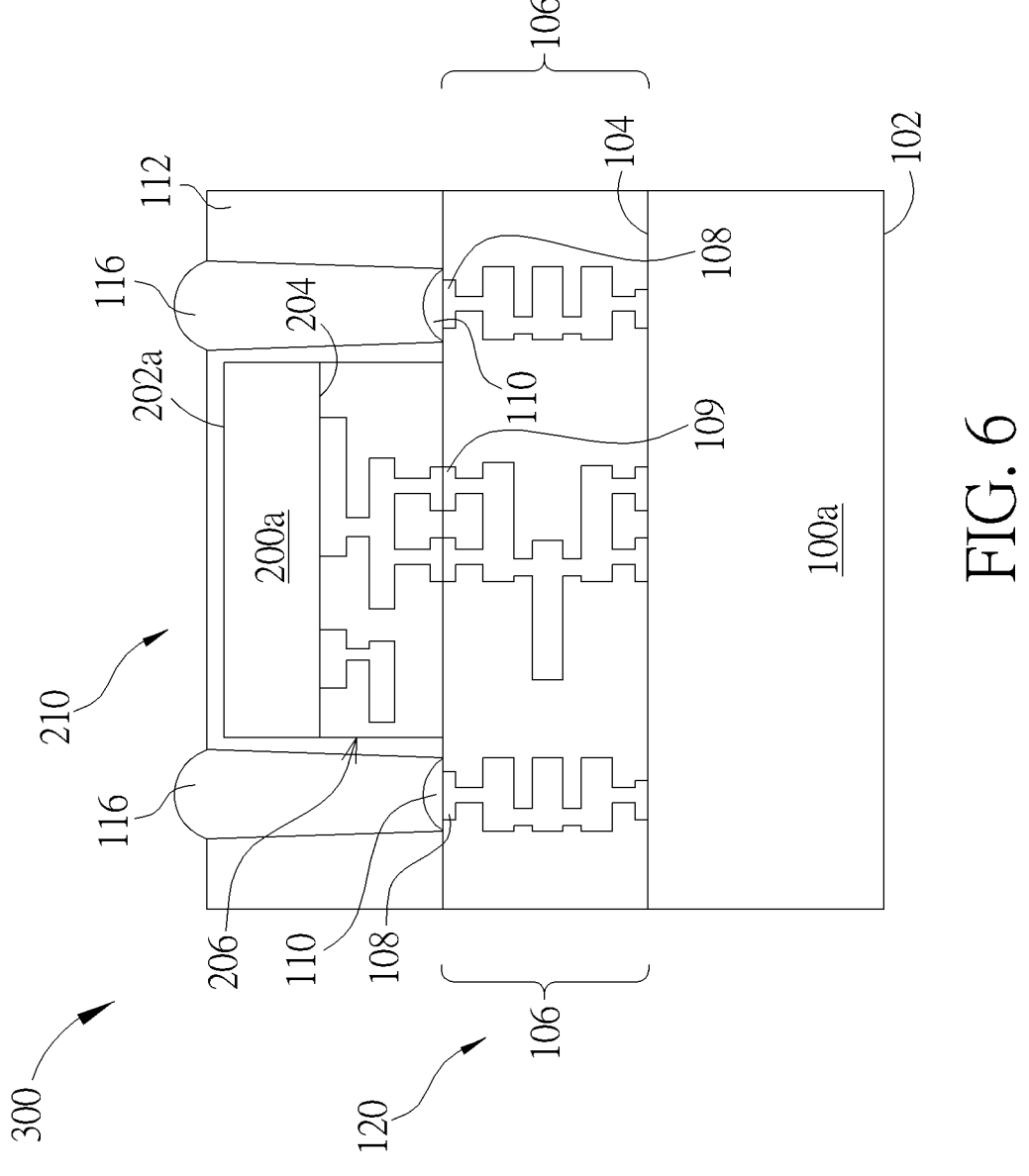

After that, the primary substrate 100 and the plurality of the interconnection structures 106 of the semiconductor structure are cut into a plurality of chips 120 as shown in FIG. 6 through a plurality of scribe lines 118 at the junctions of the die regions in the primary substrate 100 respectively, in the subsequent die saw process, wherein, each of the chips 120 includes a substrate 100a and the interconnection structure 106 disposed on the surface 104 of the substrate 100a. Meanwhile, a plurality of semiconductor packages 300 as shown in FIG. 6 is formed thereby. Through the aforementioned processes, the fabricating method of the semiconductor bonding structure and the semiconductor package of the first embodiment in the present disclosure is accomplished. Following these, the subsequent packaging process may be further performed on the semiconductor package 300, for example further mounting the semiconductor package 300 to a circuit board (not shown in the drawings) or other secondary packaging substrates via the solder pillars 116 disposed thereon, to form the required integrated circuits. Alternatively, the semiconductor package 300 may also be used directly as a chip scale package (CSP) of the wafer-level package, which is beneficial on thin and short packaging application.

As shown in FIG. 6, the semiconductor package 300 obtained by the fabricating method of the present embodiment includes the chip 120, the chip 210 stacked on the chip 120, and the conductive structure (such as the solder pillars 116), wherein the chip 210 is electrically connected to the chip 120 by directly contacting the upper surfaces 106b of the interconnection structure 106 through the interconnection structure 206 disposed on the chip 210, so that, the additional arrangement of a TSV is no longer needed. In particular, the solder pillars 116 disposed on the upper surfaces 106a of the interconnection structure 106 on the chip 120 is configured as the conductive structure of the present embodiment, and which is disposed at one side of the chip 210 and electrically connects the bonding pads 108 embedded in the interconnection structure 106. In additionally, a portion of each of the solder pillars 116 is protruded from the top surface of the molding layer 112, and is higher than the surface 202a of the chip 210, so that, the input/ output terminals may be conveniently arranged around the semiconductor package 300 in the subsequent process.

People well-skilled in the art should fully understand that the semiconductor package, the semiconductor bonding structure and/or the fabricating method thereof are not limited to be what is shown in the aforementioned embodiments, and which may further include other examples based on practical product requirements. The following description will detail other different embodiments or variant embodiments of the semiconductor package, the semiconductor bonding structure and/or the fabricating method thereof in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 7:
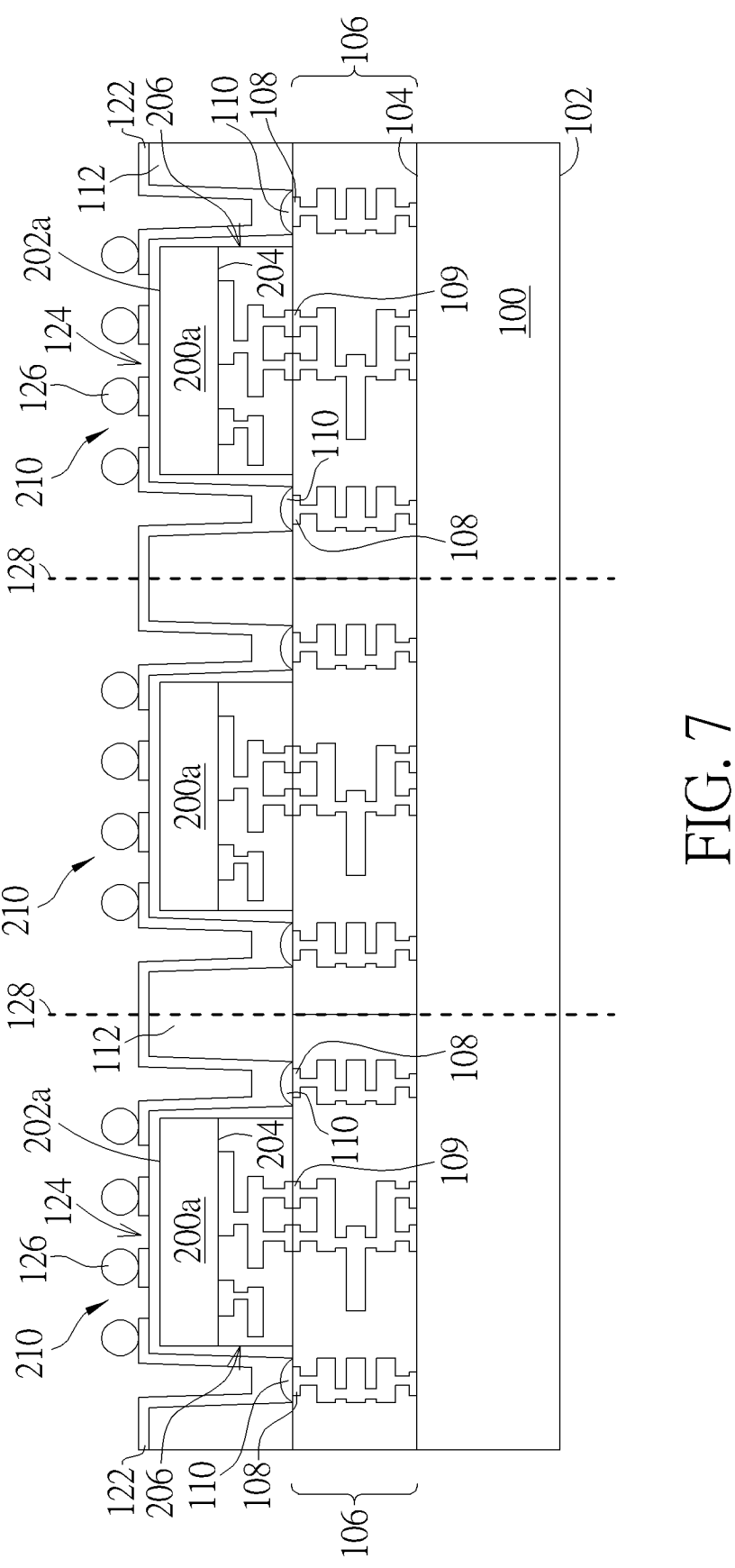
Figure 8:
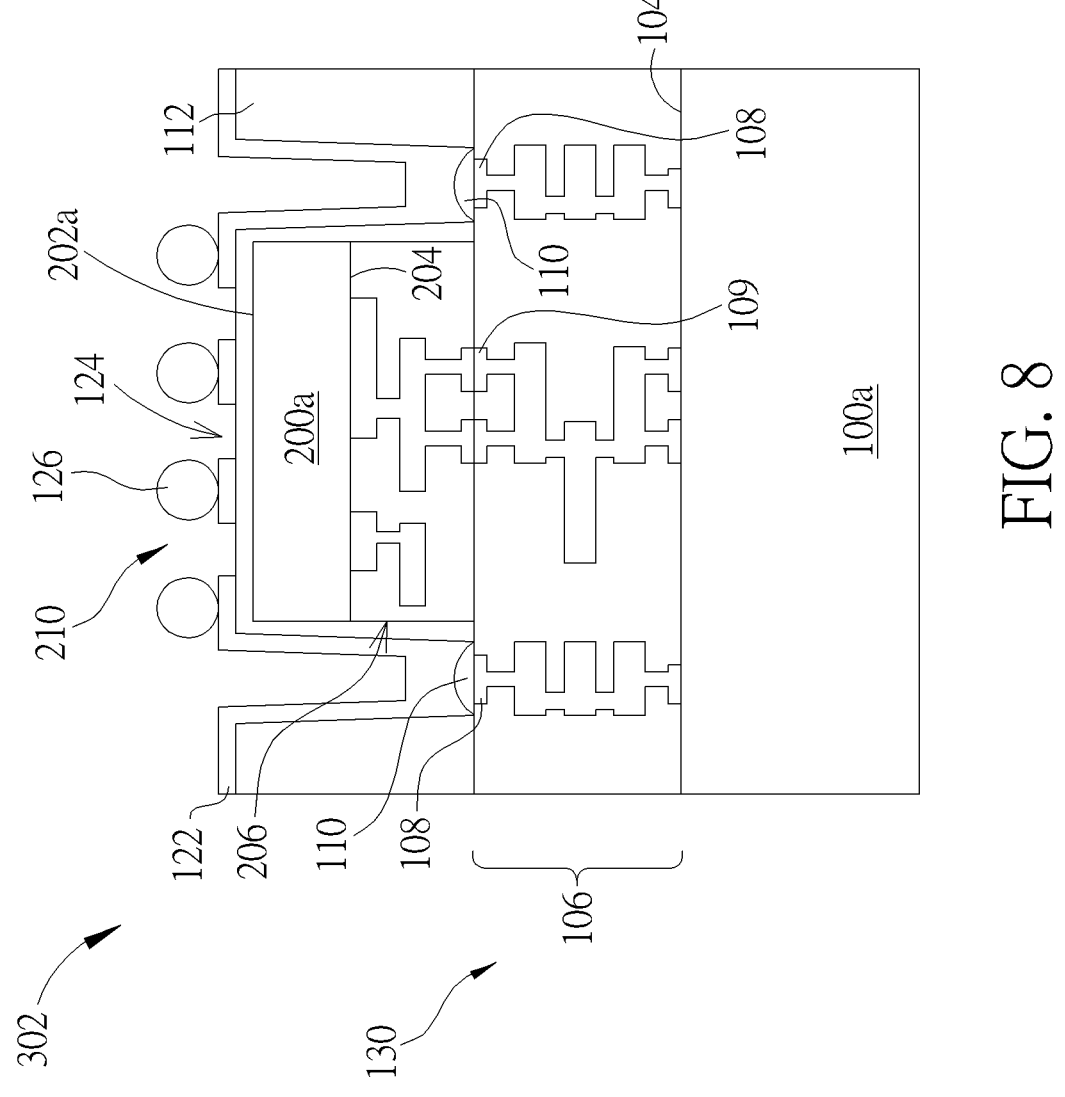

Please refer to FIG. 7 to FIG. 8, which illustrate schematic diagrams of a fabricating method of a semiconductor bonding structure and a semiconductor package according to the second embodiment of the present disclosure. The formal steps in the present embodiment are substantially the same as those in the aforementioned embodiment, as shown in FIG. 1 to FIG. 4, and which may not be redundantly described herein. The difference between the present embodiment and the aforementioned embodiment is in that, a conductive structure of the present embodiment includes at least one redistribution layer (RDL) 122 and at least one solder ball 126.

Precisely speaking, as shown in FIG. 7, the redistribution layer 122 is formed on the molding layer 112, and the formation of the redistribution layer 122 includes but not limited to the following steps. Firstly, an electroplating process is performed to form a redistribution material layer (not shown in the drawings), with the redistribution material layer conformally covering on the surfaces of the molding layer 112 and the openings 114 as shown in FIG. 4, over the upper surface 106a. Then, the redistribution material layer is partially removed through a patterning process, to form a plurality of recesses 124 to expose the molding layer 112 underneath, and the redistribution layers 122 are formed at the same time. In this way, the redistribution layers 122 may be electrically connected to the bonding pads 108 within the interconnection structure 106, and to lead out the signals of the bonding pads 108 to the surface 202a of each chip 210, so as to serve as a path for electrically connecting the bonding pads 108 with other signals. Then, the solder balls 126 are correspondingly formed on the redistribution layers 122, with each of the solder balls 126 being located over the surface 202a of each chip 210. It is noted that, although the present embodiment is only exemplified by sequentially arranging the solder balls 126 over each chip 210, people well-skilled in the art should fully realized that the practical locations and the number of the solder balls 126 and the redistribution layers 122 may both be adjusted according to the practical arranging requirements of the input/output terminals in a device. For example, in one embodiment, if being viewed through a top view (not shown in the drawings), the disposing locations of the solder balls 126 may be arranged in an array arrangement (not shown in the drawings) or a matrix arrangement (not shown in the drawings), which is beneficial on arranging a relatively large number of the input/output terminals, but is not limited thereto.

After that, the primary substrate 100 and the plurality of the interconnection structures 106 of the semiconductor structure are cut into a plurality of chips 130 as shown in FIG. 8 through a plurality of scribe lines 128 located at the junctions of the die regions in the primary substrate 100 respectively, in the subsequent die saw process. It is noted that, each of the chips 130 includes a substrate 100a and the interconnection structure 106 disposed on the surface 104 of the substrate 100a. Meanwhile, a plurality of semiconductor packages 302 as shown in FIG. 8 is formed thereby. Through the aforementioned processes, the fabricating method of the semiconductor bonding structure and the semiconductor package of the second embodiment in the present disclosure is accomplished, wherein the semiconductor package 302 may be further mounted to a circuit board (not shown in the drawings) or other secondary packaging substrates to form the required integrated circuits. Alternatively, the semiconductor package 302 may also be used directly as a wafer-level CSP.

As shown in FIG. 8, the semiconductor package 302 obtained by the fabricating method of the present embodiment includes the chip 130, the chip 210 stacked on the chip 130, and the conductive structure (for example including the redistribution layer 122 and the solder ball 126), wherein the chip 130 and the chip 210 are connected with each other via a similar manner as that of the semiconductor package 300 in the first embodiment, and which will not be redundant described herein after. In particular, the redistribution layers 122 and the solder balls 126 disposed over the upper surfaces 106a of the interconnection structure 106 on the chip 120 is configured as the conductive structure of the present embodiment, and the redistribution layers 122 directly covers the surfaces of the openings 114 as shown in FIG. 4, so as to directly contact the covering layer 110 disposed at the bottom of each opening 114 and further extend to the top surface of the molding layer 112. In this way, the solder balls 126 may be disposed on the surface 202a of the chip 210, and is higher than the top surface of the molding layer 112, to dramatically increase the disposing locations of the input/output terminals.

Figure 9:
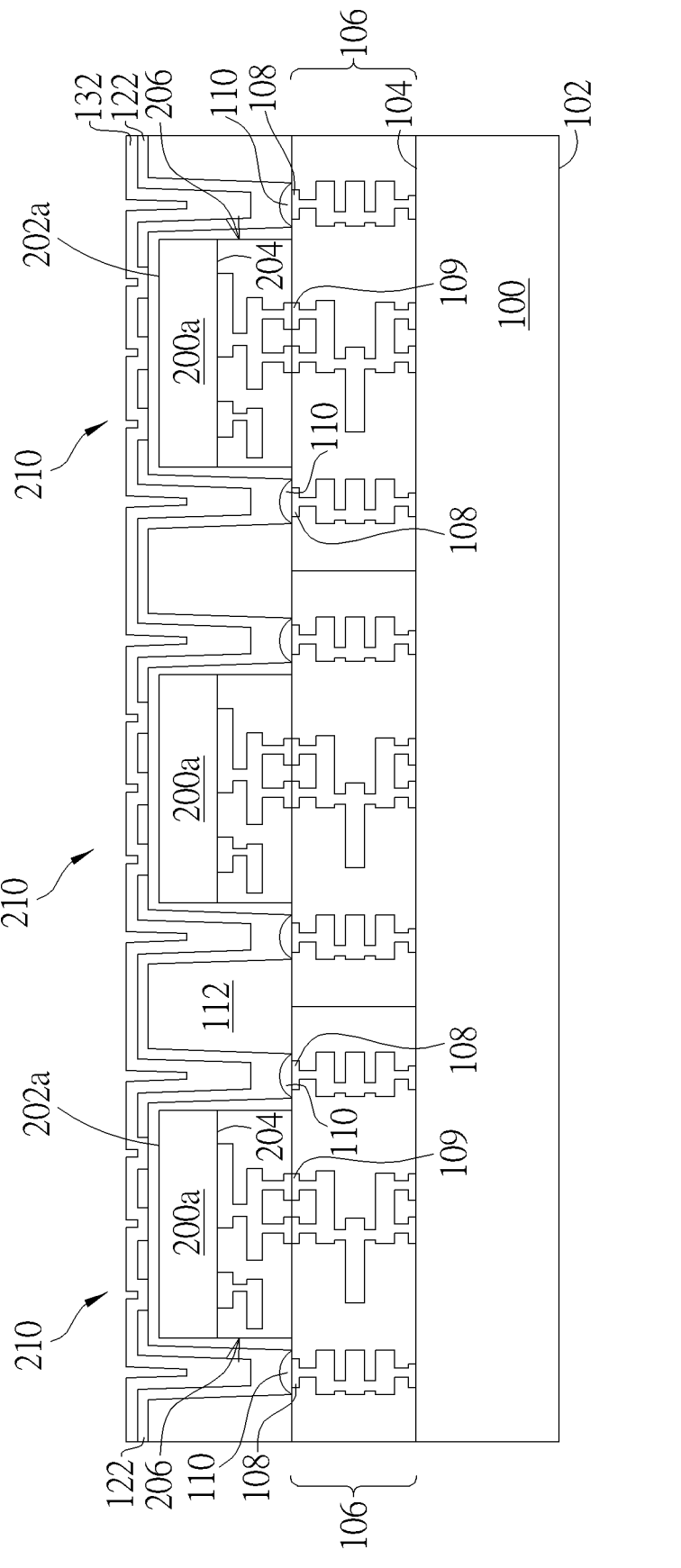
Figure 10:
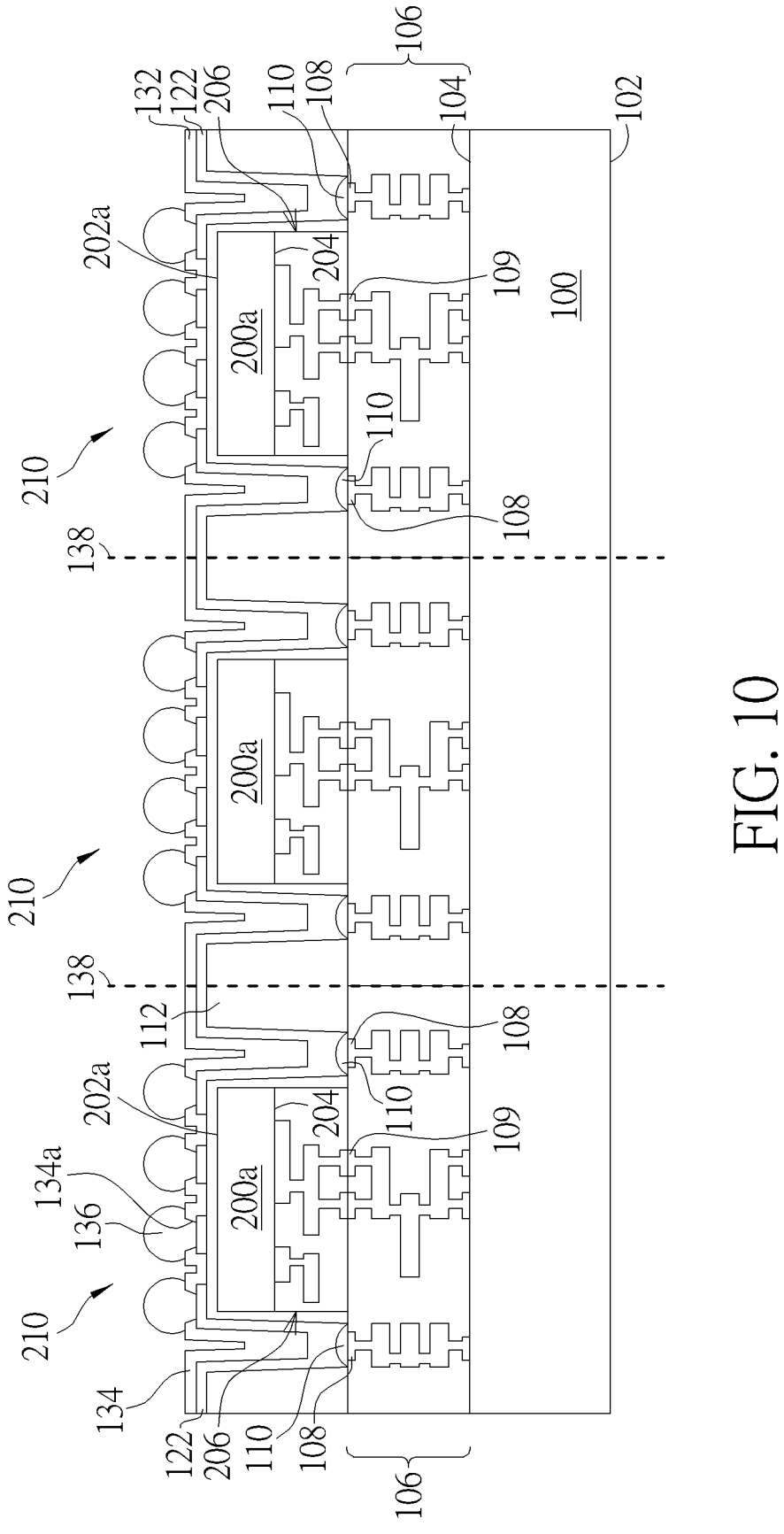
Figure 11:
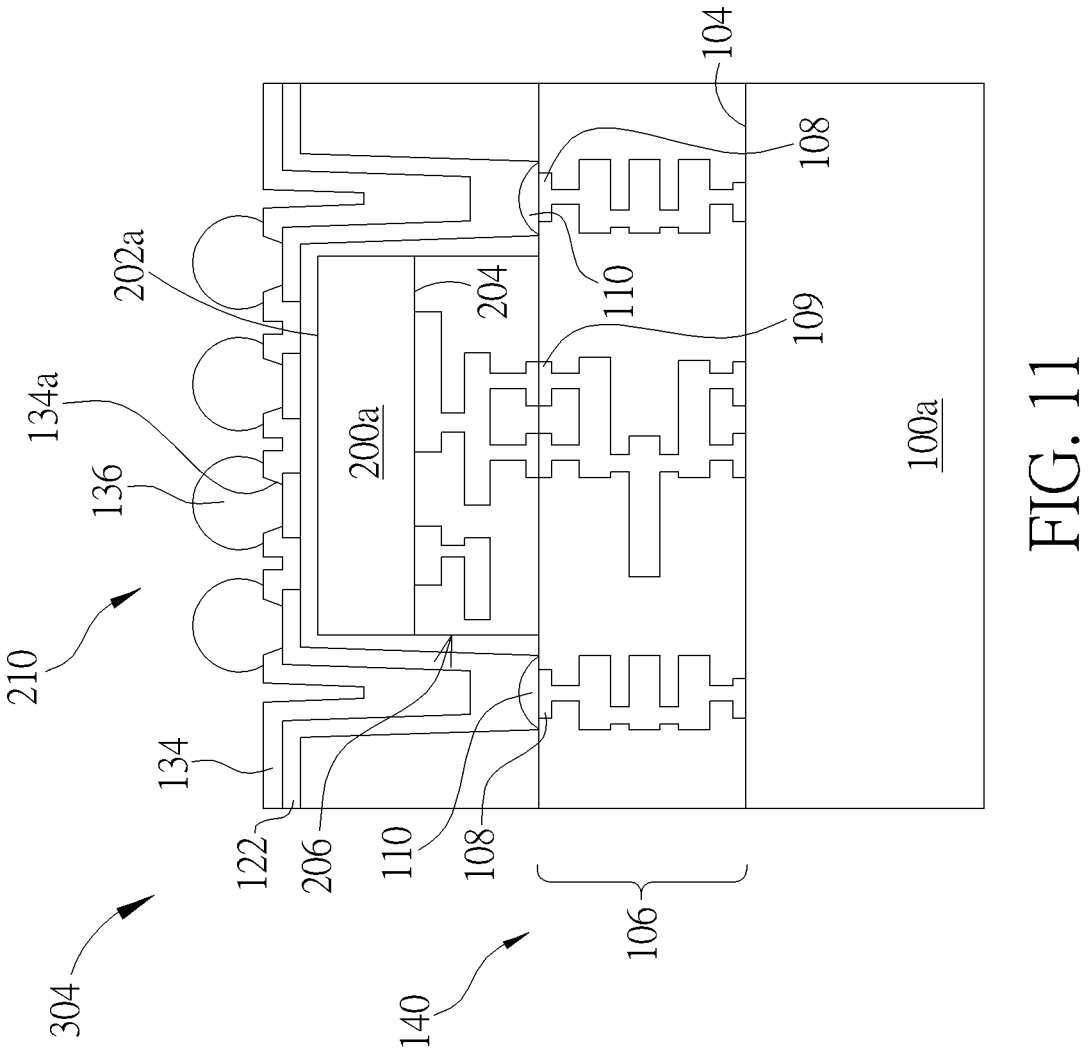

Please refer to FIG. 9 to FIG. 11, which illustrate schematic diagrams of a fabricating method of a semiconductor bonding structure and a semiconductor package according to the third embodiment of the present disclosure. The formal steps in the present embodiment are substantially the same as those in the aforementioned second embodiment, and all the similarities will not be redundantly described herein. The difference between the present embodiment and the aforementioned embodiment is in that, a protection layer 134 is additionally formed on the redistribution layers 122, to protect the redistribution layers 122.

Precisely speaking, as shown in FIG. 9, a protection material layer 132 is formed conformally to cover the redistribution layers 122 and the molding layer 112, wherein the protection material layer 132 further fills in the openings 114 as shown in FIG. 4. The protection material layer 132 for example includes a material like polyimide (PI), polyethylene (PVO), or other materials suitable serving as a passivation layer, but is not limited thereto.

As shown in FIG. 10, the protection material layer 132 is partially removed through performing a patterning process, to expose the redistribution layers 122 underneath, and to form the protection layer 134 at the same time. After that, a plurality of solder balls 136 are formed on the exposed redistribution layers 122. In this way, the solder balls 136 may also be disposed over the surface 202a of each chip 210, and a portion of the protection layer 134a may be sandwiched between each of the solder balls 136 and the redistribution layers 122. After that, the primary substrate 100 and the plurality of the interconnection structures 106 of the semiconductor structure are cut into a plurality of chips 140 as shown in FIG. 11 through a plurality of scribe lines 138 located at the junctions of the die regions of the primary substrate 100 respectively, in the subsequent die saw process. It is noted that, each of the chips 140 includes a substrate 100*a* and the interconnection structure 106 disposed on the surface 104 of the substrate 100*a*. Meanwhile, a plurality of semiconductor packages 304 as shown in FIG. 11 are formed thereby.

Through the aforementioned processes, the fabricating method of the semiconductor bonding structure and the semiconductor package of the third embodiment in the present disclosure is accomplished, wherein the semiconductor package 304 may be further mounted to a circuit board (not shown in the drawings) or other secondary packaging substrates via the solder balls 136 to form the required integrated circuits. Alternatively, the semiconductor package 304 may also be used directly as a wafer-level CSP.

As shown in FIG. 11, the semiconductor package 304 obtained by the fabricating method of the present embodiment includes the chip 140, the chip 210 stacked on the chip 140, and the conductive structure (for example including the redistribution layer 122 and the solder ball 136), wherein the chip 140 and the chip 210 are connected with each other via a similar manner as that of the semiconductor packages 300, 302 in the aforementioned embodiments, and which will not be redundant described herein after. It is noted that, the protection layer 134 is additionally disposed between the redistribution layers 122 and the solder balls 136, to protect the redistribution layers 122 underneath.

Figure 12:
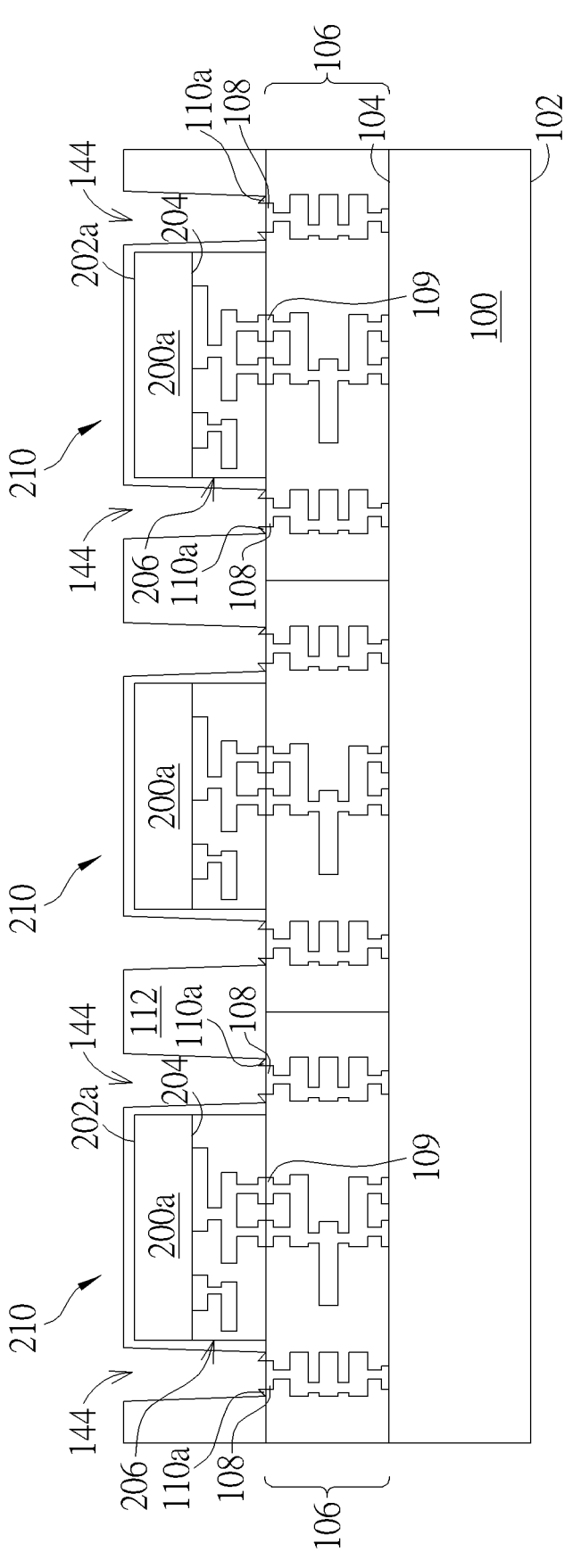
FIG. 12 illustrates a schematic diagram of a fabricating method of a semiconductor bonding structure according to a fourth embodiment of the present disclosure.

Please refer to FIG. 12, which illustrates a schematic diagram of a fabricating method of a semiconductor bonding structure and a semiconductor package according to the fourth embodiment of the present disclosure. The formal steps in the present embodiment are substantially the same as those in the aforementioned embodiment, and which may not be redundantly described herein. The difference between the present embodiment and the aforementioned embodiment is in that, the covering layer 110 of the present embodiment includes a non-conductive material having protection capability, such as a dielectric material.

Accordingly, while forming the openings 144 through the photolithography and etching process, the dry etching process or the laser burning process, the openings 144 have to further penetrate the covering layer 110 at the bottom, to expose the bonding pads 108 underneath. In one embodiment, the covering layer 110 may be removed completely. Alternately, the covering layer 110 may also be partially removed till exposing the bonding pads 108, with a portion of the covering layer 110*a* being remained at the bottom of the openings 144, as shown in FIG. 12. Then, the conductive structure formed subsequently, for example the solder pillars 116 formed in the aforementioned first embodiment or the redistribution layers 122 formed in the aforementioned second embodiment, will directly contact the bonding pads 108 underneath to electrically connect to the interconnection structure 106. With these arrangements, the semiconductor package (not shown in the drawings) obtained by the fabricating method of the present embodiment also includes the conductive structure disposed on the upper surfaces 106*a* of the interconnection structure 106, with the conductive structure being disposed at one side of the chip 210, and partially protruded from the top surface of the molding layer 112, thereby beneficial on arranging the input/output terminals.

Overall speaking, the fabricating method of the present disclosure forms the semiconductor package by using copper-to-copper direct bonding in a chip-to-wafer bonding manner, so that, the fabricating complexity and cost of the TSV may be omitted, thereby improving the stress interference caused by the TSV structure and saving the process window for the TSV. Therefore, the present disclose is allowable to form the semiconductor package with more reliable structure under a simplified fabricating process. In addition, the semiconductor package obtained by the fabricating method of the present disclosure includes a chip disposed on an upper surface of an interconnection structure within a wafer-level semiconductor structure, and a conductive structure disposed on another upper surface of the interconnection structure, with the conductive structure being disposed at a location higher than the top surface of the chip, for conveniently arranging the input/output terminals thereon in the subsequent processes. The conductive structure of the present disclosure for example includes a redistribution layer, a solder ball and/or a solder pillar, but not limited thereto. Accordingly, the semiconductor package of the present disclosure may be used directly as a CSP of wafer-level package, being beneficial on thin and short packaging application, or be further mounted to a circuit board or other secondary packaging substrates, thereby forming the required integrated circuits.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
   a first chip, comprising:
     a first substrate; and
     a first interconnection structure disposed on the first substrate, wherein an upper surface of the first interconnection structure comprises a first upper surface and a second upper surface;
   a second chip stacked on the first chip, the second chip comprising:
     a second substrate; and
     a second interconnection structure disposed on the second substrate, wherein the second interconnection structure directly and electrically connects to the first upper surface of the first interconnection structure; and
   a conductive structure, disposed at one side of the second chip and on the second upper surface of the first interconnection structure, the conductive structure electrically connected to the first interconnection structure, wherein the first upper surface of the first interconnection structure directly in contact and electrically connecting to the second interconnection structure is separated from the second upper surface of the first interconnection structure directly in contact and electrically connecting to the conductive structure.

2. The semiconductor package according to claim 1, wherein the conductive structure comprises at least one solder pillar, and a portion of the solder pillar is protruded from a surface of the second chip.

3. The semiconductor package according to claim 1, wherein the first interconnection structure of the first chip further comprises:
   a bonding pad embedded in the first interconnection structure, and the bonding pad electrically connected to the conductive structure.

4. The semiconductor package according to claim 1, further comprising:

a molding layer, covered on the second chip and the first interconnection structure, wherein the conductive structure is partially disposed in the molding layer.

* * * * *